United States Patent
Lim et al.

(10) Patent No.: US 7,446,462 B2
(45) Date of Patent: Nov. 4, 2008

(54) BRIGHTNESS-ENHANCED MULTILAYER OPTICAL FILM WITH LOW REFLECTIVITY FOR DISPLAY AND ORGANIC LIGHT EMITTING DIODE DISPLAY USING THE SAME

(75) Inventors: Sang Kyoo Lim, Gyeonggi-Do (KR); Tae Kyung Kim, Seoul (KR); Hwi Min Seo, Seoul (KR); Lee Hwa Song, Gyeonggi-Do (KR)

(73) Assignee: Cheil Industries, Inc., Gyeongsangbuk-Do (KR)

( * ) Notice: Subject to any disclaimer, the term of this patent is extended or adjusted under 35 U.S.C. 154(b) by 490 days.

(21) Appl. No.: 11/174,901

(22) Filed: Jul. 5, 2005

(65) Prior Publication Data

US 2006/0186803 A1   Aug. 24, 2006

(30) Foreign Application Priority Data

Feb. 23, 2005   (KR)   ............... 10-2005-0014862

(51) Int. Cl.
*H01J 5/16*   (2006.01)
*H01J 61/40*   (2006.01)
*H01K 1/26*   (2006.01)
*H01K 1/30*   (2006.01)

(52) U.S. Cl. ............... 313/112; 313/498; 313/506; 313/512; 359/599

(58) Field of Classification Search ............... 313/498, 313/502, 504, 506, 512, 112; 359/599, 614, 359/628, 664, 707

See application file for complete search history.

(56) References Cited

U.S. PATENT DOCUMENTS

| 5,445,899 | A | 8/1995 | Budzilek et al. |
| 5,781,344 | A * | 7/1998 | Vance ............... 359/614 |
| 6,261,402 | B1 * | 7/2001 | Watanabe et al. ........ 156/230 |
| 6,912,089 | B2 * | 6/2005 | Nakagawa et al. ........ 359/599 |
| 2002/0043931 | A1 * | 4/2002 | Minoura et al. ............ 313/506 |

FOREIGN PATENT DOCUMENTS

| JP | 09-127885 | 5/1997 |
| KR | 2003-013923 | 2/2003 |
| WO | WO 03/015475 | 2/2003 |

* cited by examiner

*Primary Examiner*—Joseph L. Williams
*Assistant Examiner*—Kevin Quarterman
(74) *Attorney, Agent, or Firm*—Saliwanchik, Lloyd & Saliwanchik

(57) ABSTRACT

The subject invention features a low-reflectivity, brightness-enhancing multilayer optical film for enhancing the brightness of an organic light emission diode (OLED) display and imparting anti-reflection performance to the display.

17 Claims, 4 Drawing Sheets

< Average surface reflectance: 5% (380nm ~ 750nm) >

BRIGHTNESS-ENHANCED MULTILAYER OPTICAL FILM WITH LOW REFLECTIVITY FOR DISPLAY AND ORGANIC LIGHT EMITTING DIODE DISPLAY USING THE SAME

BACKGROUND OF THE INVENTION

This non-provisional application claims priority under 35 U.S.C. § 119(a) on Korean Patent Application No. 2005-14862 filed on Feb. 23, 2005, which is herein incorporated by reference.

FIELD OF THE INVENTION

The present invention relates to a low-reflectivity, brightness-enhancing multilayer optical film that can be used in a display, and more particularly to a brightness-enhancing multilayer optical film comprising a transparent substrate, a light diffusion layer formed on the transparent substrate by wet coating and a light-absorbing layer formed on the light diffusion layer by wet coating wherein the substrate has a thickness of 10~300 µm, the light diffusion layer contains a resin and spherical particles, and the light-absorbing layer contains 50~500 parts by weight of core-shell structured light-absorbing particles composed of a light-absorbing agent as a material for the core and a transparent resin as a material for the shell.

The present invention also relates to an organic light emitting diode display using the optical film, and more particularly to an organic light emitting diode display wherein the optical film is positioned on top of a transparent substrate of a light-emitting device including a cathode, a light-emitting layer, an anode and the transparent substrate laminated in this order from the bottom, or is mounted on either an upper or lower surface of a light-emitting device including a cathode, a light-emitting layer and an anode laminated in this order.

DESCRIPTION OF THE RELATED ART

Light-emitting devices of organic light emitting diode displays have a structure wherein a light-emitting material is injected between a high work function electrode and a low work function electrode. The high work function electrode is used as an anode for hole injection and the low work function electrode is used as a cathode for electron injection. Specifically, the light-emitting device shown in FIG. 1 includes a cathode, an electron transport layer, a light-emitting layer, a hole transport layer, a hole injection layer, an anode, and a glass substrate laminated in this order from the top.

Figure 1:
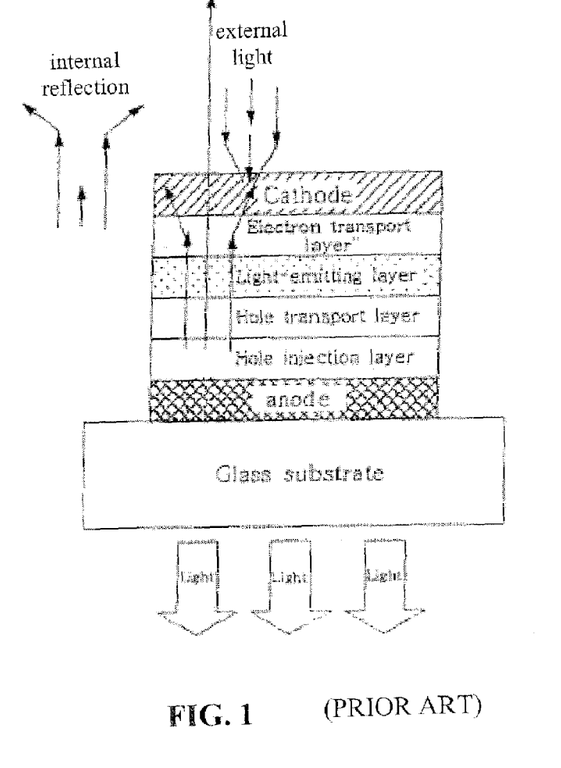
FIG. 1 is a cross-sectional view schematically showing the structure of an organic light emitting diode.

The light emission principle of an organic light emitting diode (hereinafter, abbreviated as "OLED") is as follows. Holes injected from a high work function anode are bonded to electrons injected from a low work function cathode in the light-emitting layer to emit light at particular wavelengths. The light emitted from the light-emitting layer propagates toward the transparent substrate, as shown in FIG. 1.

For easy electron injection and better light emission efficiency, the cathode is commonly made of a low work function metal selected from magnesium (Mg), magnesium-silver alloy (MgAg), aluminum (Al), lithium-aluminum alloy (LiAl) and calcium (Ca). Such a metal electrode is so surface-reflective that a large amount of external light incident to the light-emitting device is reflected from the cathode. This internal reflection of the external light from the cathode becomes a cause of deterioration in the contrast of an OLED display.

For the purpose of improving the deteriorated contrast of an OLED display, the use of a circular polarizing plate consisting of a linear polarizing plate and a quarter (¼)—wavelength plate is described in Japanese Patent Laid-open No. 1997-127885. Although the use of the circular polarizing plate increases the contrast ratio of an OLED display as compared to that not using the polarizing plate, the light transmittance is reduced to about 45% by the polarizing plate, considerably degrading the brightness of the display.

Figure 2:
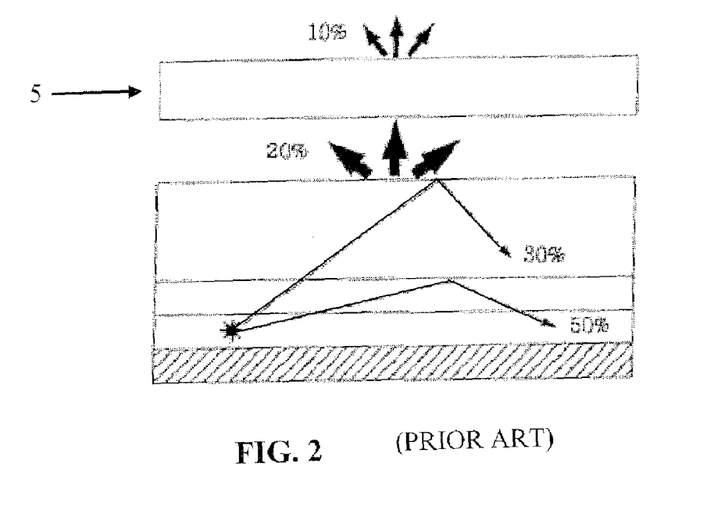
FIG. 2 is an exemplary diagram schematically showing a cause of brightness degradation in a conventional organic light emitting diode display.

As shown in FIG. 2, main causes of brightness degradation in a conventional OLED display are total reflection effects, resulting from different refractive indices of respective layers constituting a light-emitting device, and a polarization phenomenon, resulting from the use of a circular polarizing plate 5. If the relative brightness of light emitted from a light-emitting layer of the light-emitting device is 100, the final brightness of the light passed sequentially through a hole transport layer, a hole injection layer, an anode and a transparent substrate is decreased to about 20. When the light emitted from the light-emitting device passes the circular polarizing film, the brightness is further decreased to about 10. Finally, the OLED display has a low light-output efficiency of about 10%.

Further, Korean Patent Laid-open No. 2003-0013923 suggests a light-emitting device for enhancing brightness degradation caused by the use of the circular polarizing film. According to this patent publication, the light-emitting device comprises a transparent substrate, an anode formed on the transparent substrate, a light-emitting layer formed on the anode, an electron injection layer or electron transport layer formed on the light-emitting layer, and a cathode formed on the electron injection layer or electron transport layer wherein a light-absorbing material is contained in at least one layer of the layers or injected between the layers. The light-absorbing material contained or injected in this manner reduces the amount of external light entering the light-emitting device can be reduced, but absorbs a portion of light generated from the light-emitting layer, dropping the light-output efficiency of the light-emitting device. As a result, the light-emitting device shows poor brightness properties. Further, since mixing the light-absorbing material with materials constituting the electron transport layer and the electron injection layer or formation of an additional light-absorbing layer is a process changing the layer structure and the layer-constituent materials of the light-emitting device, the light-emitting device is fabricated through difficult layer formation in low yield at increased costs as compared to conventional fabrication of light-emitting devices. Apart from the light-absorbing layer, a separate anti-reflective film must be further formed on the transparent substrate (corresponding to the glass substrate shown in FIG. 1) in order to impart anti-reflective performance to the light-emitting device.

SUMMARY OF THE INVENTION

It is an object of the present invention to provide a brightness-enhancing multilayer optical film with low reflectivity for an OLED display and an OLED display using the optical film.

Since the OLED display comprising the optical film of the present invention has high output efficiency of light emitted from a light-emitting device of the display, it has the advantages that high-brightness properties and anti-reflection performance can be attained.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described in more detail.

Figure 3:
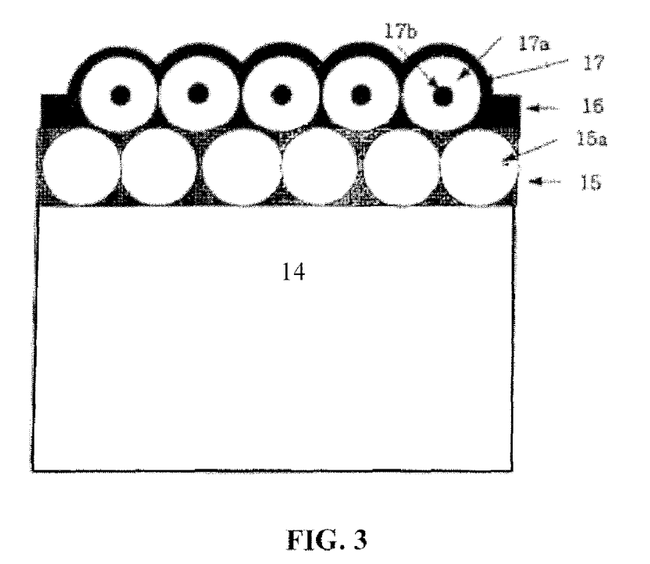
FIG. 3 is a view showing the structure of a coating layer of an optical film according to one embodiment of the present invention.

As shown in FIG. 3, a low-reflectivity, brightness-enhancing multilayer optical film of the present invention serves to enhance the luminescent brightness of a display and impart anti-reflection performance to the display. Specifically, the optical film of the present invention comprises a transparent substrate 14, a light diffusion layer 15 formed on the transparent substrate 14 by wet coating and a light-absorbing layer formed on the light diffusion layer 15 by wet coating wherein the substrate has a thickness of 10~300 μm, the light diffusion layer 15 contains a resin and spherical particles 15a, and the light-absorbing layer 16 contains 50~500 parts by weight of core-shell structured light-absorbing particles 17 composed of a light-absorbing agent as a material for the core 17b and a transparent resin as a material for the shell 17a.

Figure 5:
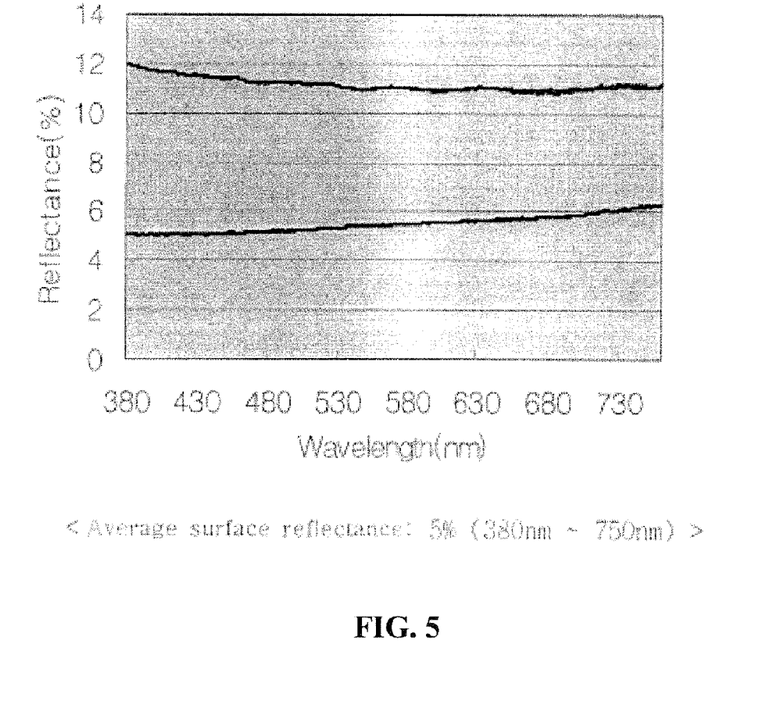
FIG. 5 is a graph showing the surface reflectance of an optical film according to the present invention.

Since the optical film of the present invention has microlenses formed from the light-absorbing particles on the surface, it shows superior low-reflection properties due to scattered reflection effects, as is apparent from the reflectance graph shown in FIG. 5.

The present invention also provides an OLED display wherein the unidirectional transmission type multilayer optical film of the present invention is mounted on top of a transparent substrate 14 of a light-emitting device including a cathode, a light-emitting layer, an anode and the transparent substrate 14 laminated in this order from the bottom, or on either an upper or lower surface of a light-emitting device including a cathode, a light-emitting layer and an anode laminated in this layer such that the light-absorbing layer 16 of the optical film is positioned opposite to the light-emitting device.

Figure 4:
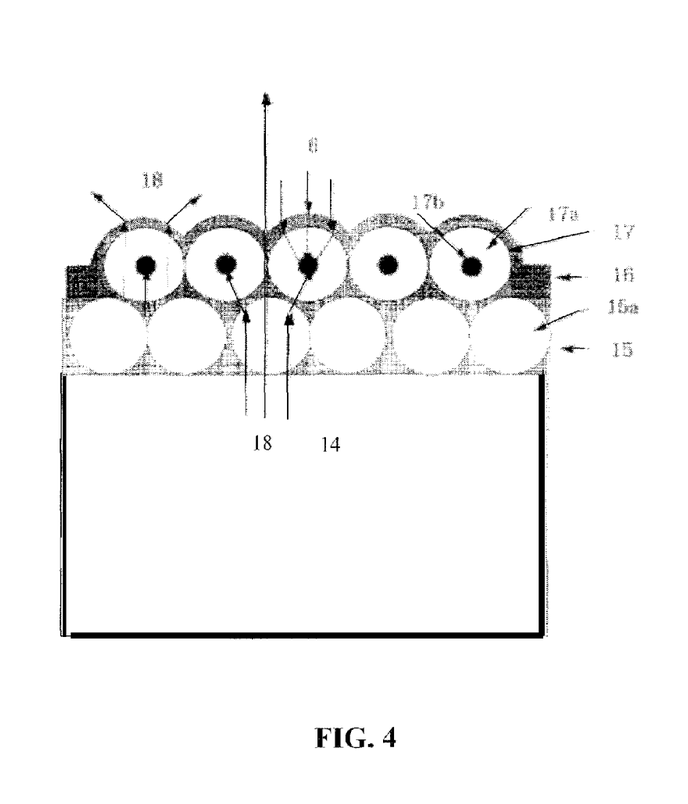
FIG. 4 is an exemplary diagram schematically showing the principles and functions of an optical film according to the present invention.

The optical film of the present invention is produced by applying a light diffusion layer 15 (FIG. 4) containing a resin and spherical particles 15a to a transparent substrate 14, and applying core-shell structured light-absorbing particles 17 composed of a light-absorbing agent as a material for the core 17b and a transparent resin as a material for the shell 17a, together with a transparent resin acting as a binder, to the light diffusion layer 15. The structure of the optical film according to the present invention is shown in FIG. 3. In the case where the refractive index of the resin constituting the shell 17a of the light-absorbing particles is identical or similar to that of the transparent resin acting as a binder, as shown in FIG. 4, the optical interface between the shell 17a and the binder disappears and thus semicircular lens effects take place. Alternatively, even when the refractive index of the resin constituting the shell 17a of the light-absorbing particles is different from that of the transparent resin acting as a binder, semicircular lens effects may still take place due to the surface shape of the optical film.

Figure 7:
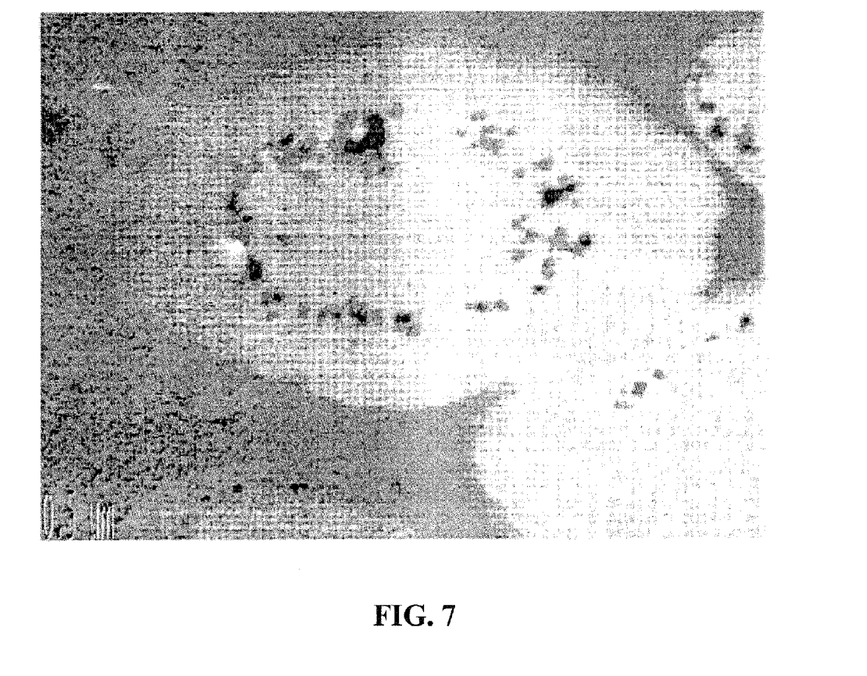
FIG. 7 is a cross-sectional image of light-absorbing particles of an optical film according to the present invention.
Figure 8:
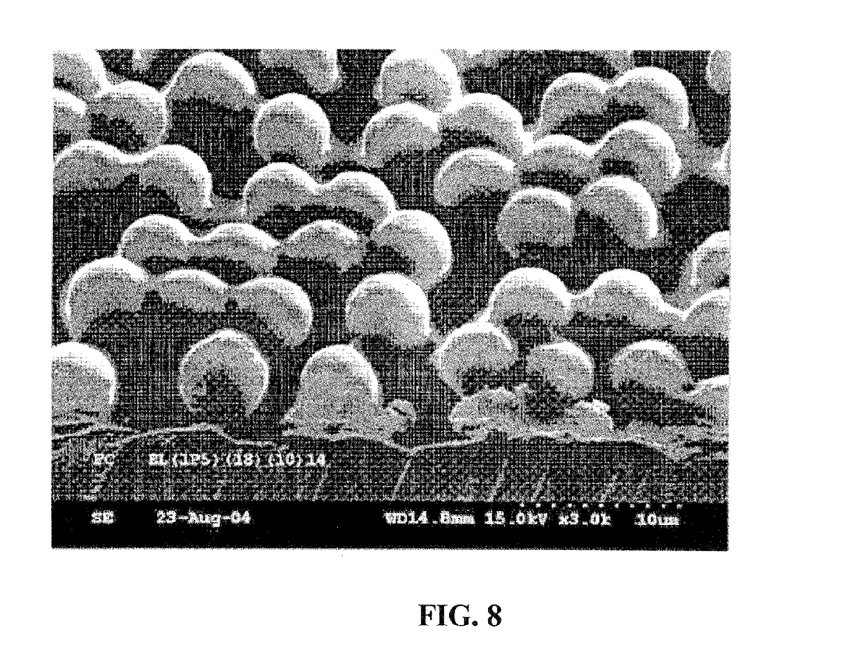
FIG. 8 is a photograph showing the surface of a light-absorbing layer of an optical film according to the present invention.

As described above, the optical film of the present invention is produced by forming a light diffusion layer 15 containing a resin and spherical particles 15a on the transparent substrate 14, and forming a light-absorbing layer 16 (FIG. 7) containing core-shell structured light-absorbing particles 17 composed of a light-absorbing agent as a material for the core 17b and a transparent resin as a material for the shell 17a, together with a transparent resin, on the light diffusion layer 15. As shown in FIG. 4, when internal light 18 emitted from the light-emitting layer of the light-emitting device passes through the light diffusion layer 15 where the light is diffused, only a small amount of the light incident to the light-absorbing agent is absorbed and the rest of the internal light 18 diffused by the light diffusion layer 15 exits the display. Accordingly, the display of the present invention shows high light-output efficiency when compared to conventional OLED displays using circular polarizing plates, and thus high-brightness properties can be attained.

As shown in FIG. 4, external light 6 entering the display is collected in the direction of the light-absorbing core 17b due to semicircular lens effects at the surface of the optical film and is absorbed by the core 17b. Internal reflection of the external light 6 from a metal constituting the cathode is minimized by the action of the core 17b, and thus an improvement in the contrast of the display can also be expected.

Hereinafter, the respective elements constituting the optical film according to the present invention will be explained in more detail.

[Transparent Substrate]

There is no restriction for the transparent substrate 14 used to produce the optical film of the present invention so long as the transparent substrate 14 is a highly transparent film having a high transmittance, a low haze, and superior mechanical properties. Examples of preferred transparent substrates 14 include, but are not limited to, polyethylene terephthalate (PET) films, polyethylene naphthalate (PEN) films, polycarbonate (PC) films, polystyrene films, polyvinyl chloride films, polyethylene films, polypropylene films, cycloolefin copolymer (COC) films, triacetyl cellulose (TAC) films, and combinations thereof. These transparent substrates preferably have a thickness of 10~300 μm. If a transparent substrate 14 having a thickness of less than 10 μm is used, problems may arise that wrinkles occur by thermal shrinkage and a tension applied to the film during coating and drying. Further, disadvantages associated with the use of a thin transparent substrate 14 are that the light-absorbing layer 16 is shrunk during drying and thus curling may take place at the edges of the substrate when cutting to the desired size of the OLED display. On the other hand, if a transparent substrate 14 having a thickness exceeding 300 μm is used, it cannot be easily wound in a roll form, making the substrate difficult to handle.

The light-absorbing layer 16 can be formed on a sheet-like transparent substrate without losing the inherent functions of the light-absorbing layer 16. In the case where a transparent sheet is used instead of the film-like transparent substrate, protective functions for the light-emitting device can be improved. Examples of suitable transparent sheets include, without any limitation, highly transparent acrylic sheets, highly transparent polycarbonate sheets, and highly transparent polyester sheets.

[Multilayer Structure]

As shown in FIG. 3, the multilayer optical film of the present invention comprises a light diffusion layer 15 containing a resin and spherical particles 15a, and a light-absorbing layer 16 containing core-shell structured light-absorbing particles 17 and a transparent resin acting as a binder formed on the light diffusion layer 15 wherein the core-shell structured light-absorbing particles 17 are composed of a light-absorbing agent as a material for the core 17b and a transparent resin as a material for the shell 17a.

The light-diffusing particles constituting the light diffusion layer are preferably arranged to have a monolayer structure without lamination in light of superior optical properties. Of course, the light-diffusing particles show optical properties despite multilayer arrangement.

The light-diffusing particles constituting the light diffusion layer are spherical transparent particles selected from the group consisting of silica, acrylic resins, polystyrene resins, styrene-acrylic copolymer resins, polyethylene resins, epoxy resins, silicone resins, silicone rubbers, and mixtures thereof. The light-diffusing particles preferably have an average diameter of 1 μm to 10 μm, and more preferably 1 μm to 5 μm. As a transparent resin acting as a binder in the light diffusion layer, there can be used a UV- or heat-curable resin. Examples of suitable transparent resins include, but are not limited to, acrylic resins, such as homopolymers and copolymers containing an acrylic ester as a monomer, methacrylic resins, such as homopolymers and copolymers containing a methacrylic ester as a monomer, urethane resins, polyester resins, styrene-acrylonitrile copolymer resins, styrene resins, polyvinyl chloride resins, butyral resins, silicone resins, epoxy resins, melamine resins, and mixtures thereof. Highly transparent acrylic resins and methacrylic resins having high light transmittance are more preferred.

A monomer that can be used to prepare the heat-curable resin is acrylic acid, methacrylic acid, acrylate, methacrylate, ethylacrylate, butylacrylate, methylacrylate, methylmethacrylate, ethylmethacrylate, butylmethacrylate, hydroxymethylacrylate, hydroxyethylacrylate, hydroxybutylacrylate, hydroxymethylmethacrylate, hydroxyethylmethacrylate, hydroxybutylmethacrylate, or the like. The heat-curable resin can be easily prepared by subjecting the monomer to radical-polymerization using a suitable initiator in an appropriate organic solvent, e.g., methyl ethyl ketone. Since the heat-curable acrylic resin has a polar functional group, such as hydroxyl or carboxyl group, in the side chains of the resin, it can form hydrogen bonds with the substrate, such as polyester or cellulose acetate substrate. The hydrogen bonds contribute to an improvement in the adhesion of the coating to the substrate.

It is desirable that a curing agent for the heat-curable resin can easily react with the reactive group (e.g., hydroxyl or carboxyl group) of heat-curable acrylic resin, and, for instance, is at least one compound selected from the group consisting of isocyanate, melamine formaldehyde, urea formaldehyde, polyaziridine, titanate, zirconium composite, and epoxy.

In view of preparation efficiency, preparation costs and scratch resistance, a UV-curable resin is more suitable as the binder of the light diffusion layer. A UV-curable light diffusion layer can be formed by adding a UV-curable resin, the light-diffusing particles and additives in a predetermined ratio to an appropriate solvent, and dissolving or dispersing the mixture to obtain a coating solution, and applying the coating solution to the transparent substrate. As the additives, there can be exemplified photopolymerization initiators, UV absorbers, photostabilizers, antioxidants, leveling agents, defoamers, coupling agents, particle dispersants, and other additives.

As UV-curable resins, there can be used, without any limitation, compositions in which a monomer, an oligomer and a prepolymer containing at least one polymerizable unsaturated bond, such as acryloyl, methacryloyl, acryloyloxy or methacryloyloxy group, are properly mixed according to the intended application. Examples of suitable monomers include, but are not limited to, methacrylate, methylmethacrylate, methoxy polyethylene methacrylate, cyclohexylmethacrylate, phenoxyethylmethacrylate, ethyleneglycoldimethacrylate, dipentaerythritolhexaacrylate, and styrene. Examples of suitable oligomers or prepolymers include, but are not limited to, acrylates, such as polyester acrylate, polyurethane acrylate, epoxy acrylate, polyethyl acrylate, alkyd acrylate, melamine acrylate and silicone acrylate, unsaturated polyesters, and epoxy-based compounds. In the case where the cured film is required to have superior durability, such as heat resistance, wear resistance and solvent resistance, under severe conditions, it is preferred to increase the amount of the monomer used and to use a tri- or higher functionality acrylate-based monomer.

It is necessary to add a photopolymerization initiator to cure the UV-curable resin. The photopolymerization initiator is preferably selected from the group consisting of acetophenones, e.g., diethoxyacetophenone, benzyldimethylketal and 1-hydroxycyclohexyl-phenylketone; benzoin ethers, e.g., benzoin methyl ether, benzoin ethyl ether, benzoin isopropyl ether and benzoin isobutyl ether; benzophenones, e.g., benzophenone, 4-phenylbenzophenone, 4-benzoyl-N,N-dimethyl-N-[2-(1-oxo-2-propenyloxy)ethyl]benzenemethanaminium bromide and (4-benzoylbenzyl)trimethylammonium chloride; thioxanthones, e.g., 2,4-diethylthioxanthone and 1-chloro-4-dichlorothioxanthone; 2,4,6-trimethylbenzoyldiphenylbenzoyloxide; and mixtures thereof, but are not limited thereto. As a promoter (sensitizer), there can be used an amine compound, e.g., N,N-dimethylparatoluidine. The content of the photopolymerization initiator is preferably 0.1~10 wt % with respect to the solid content of the UV-curable resin.

Figure 6:
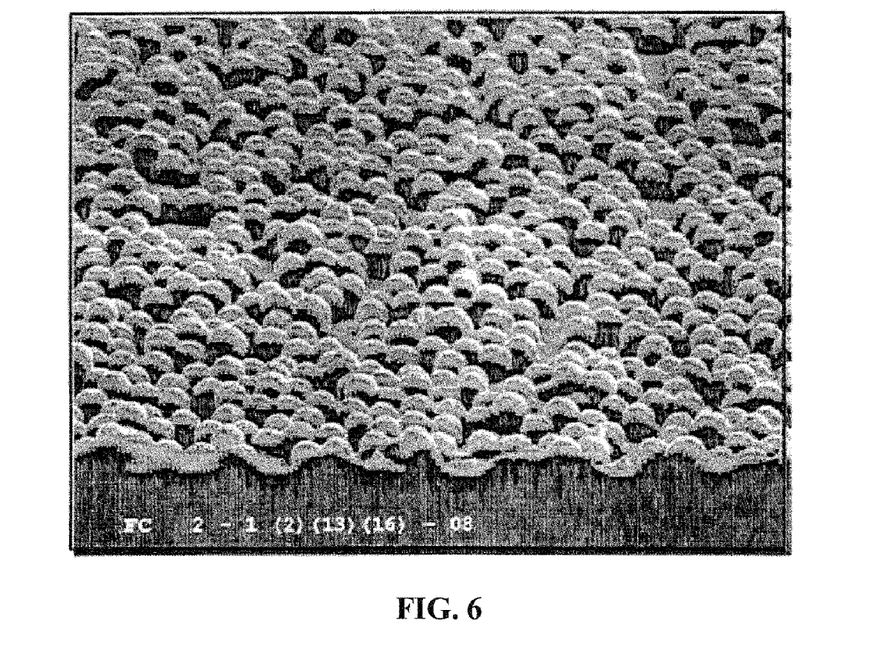
FIG. 6 is a photograph showing the surface of a light diffusion layer of an optical film according to the present invention.

As shown in FIG. 6, the light-diffusing particles constituting the light diffusion layer 15 are preferably arranged to have a monolayer structure without any lamination in light of superior optical properties.

The light-diffusing particles and the transparent resin are applied to the transparent substrate by wet coating, without limitation, e.g., gravure coating, die coating, comma coating or capillary coating.

The light-absorbing agent constituting the core of the light-absorbing particles is not particularly restricted so long as it can sufficiently absorb light. Examples of suitable light-absorbing agents include carbon black, black pigments, black dyes, iron oxides, and mixtures thereof. These light-absorbing agents can be used alone or in combination with a resin to constitute the core.

Examples of materials constituting the shell of the light-absorbing particles include highly transparent resins having high light transmittance, such as acrylic resins, methacrylic resins, polystyrene resins, acrylic-styrene copolymer resins, polyethylene terephthalate resins and mixtures thereof, but are not limited thereto. The use of a highly transparent crosslinking type resin as a shell-constituent material for the light-absorbing particles is more preferred in terms of improved resistance to solvents, chemicals, light and heat.

The light-absorbing particles are suitably spherical and preferably have a diameter of 1 μm to 50 μm. When the diameter of the light-absorbing particles is less than 1 μm, it is difficult to arrange the light-absorbing particles into a monolayer by the above-mentioned wet coating processes. Meanwhile, when the diameter of the light-absorbing particles exceeds 50 μm, the number of particles contained in one pixel of the display is small, making it impossible to effectively block external light incident to the display and degrading the image sharpness. In addition, in the case of light-absorbing particles exceeding 50 μm in diameter, since semicircular lenses protruded from the surface of the optical film cannot form minute irregularities, low-reflection properties cannot be attained. Optical films are commonly mounted on the outermost portion of OLED displays, like anti-reflective films of plasma display panel (PDP) televisions. Accordingly, optical films should have low-reflection properties to prevent glaring and to improve the image sharpness. As can be seen from the reflectance graph shown in FIG. 6, the average surface reflectance of the optical film according to the present invention is as low as 5%.

It is preferable that one core is present in one light-absorbing particle. If two or more cores are present in one light-absorbing particle, the light-absorption rate of external light entering the display is increased but the output efficiency of light emitted from the light-emitting device is decreased, thus causing the display to have a low brightness. The position of the core inside the light-absorbing particle can be expressed as an eccentricity calculated by the following equation:

Eccentricity=(distance from the center of the light-absorbing particle to the center of the core)÷(radius of the light-absorbing particle).

The eccentricity of the core is in the range of 0 to 1.0 and preferably below 0.5.

External light entering the display is collected in a center direction of the light-absorbing particles due to semicircular lens effects in the course of passing the unidirectional transmission type optical film of the present invention. When the eccentricity of the core is greater than 0.5, most of the collected light is not blocked by the light-absorbing agent and is incident to the light-emitting device, causing reflection from a metal electrode as the cathode and a cause of deterioration in the contrast of the display.

When the average diameter ratio of the core to the light-absorbing particle is between 0.2 and 0.75, the optical film has superior brightness properties. On the other hand, when the diameter ratio of the core to the light-absorbing particle is greater than 0.75, externally incident light can be effectively blocked but most of the light emitted from the light-emitting device is absorbed by the core, degrading the luminescent brightness. As described above, conventional displays employing a circular polarizing plate have a low light transmittance of about 45% due to a polarization phenomenon. Likewise, when the diameter ratio of the core to the light-absorbing particle exceeds 0.75, the display has a light transmittance of 50% or lower.

It is preferable that 50~500 parts by weight of the light-absorbing particles constituting the light-absorbing layer are mixed with 100 parts by weight of the transparent resin. If the light-absorbing particles are mixed in an amount of less than 50 parts by weight, they are completely covered with the transparent resin when coated on the transparent substrate, rendering semicircular lens difficult to form on the surface of the optical film. Further, regions containing no particles may be formed on the coated layer. Meanwhile, when the light-absorbing particles are mixed in an amount exceeding 500 parts by weight, they are not sufficiently surrounded by the transparent resin, thus causing deintercalation of the particles and lamination of the particles without being coated into a monolayer.

As a transparent resin acting as a binder in the light-absorbing layer, there can be used a UV- or heat-curable resin. Examples of suitable transparent resins include, but are not limited to, acrylic resins, such as homopolymers and copolymers containing an acrylic ester as a monomer, methacrylic resins, such as homopolymers and copolymers containing a methacrylic ester as a monomer, urethane resins, polyester resins, styrene-acrylonitrile copolymer resins, styrene resins, polyvinyl chloride resins, butyral resins, silicone resins, epoxy resins, and melamine resins. Highly transparent acrylic resins and methacrylic resins having high light transmittance are more preferred.

Examples of monomers that can be used to prepare the heat-curable resin include, but are not limited to, acrylic acid, methacrylic acid, acrylate, methacrylate, ethylacrylate, butylacrylate, methylacrylate, methylmethacrylate, ethylmethacrylate, butylmethacrylate, hydroxymethylacrylate, hydroxyethylacrylate, hydroxybutylacrylate, hydroxymethylmethacrylate, hydroxyethylmethacrylate, and hydroxybutylmethacrylate. The heat-curable resin can be easily prepared by subjecting the monomer to radical-polymerization using a suitable initiator in an appropriate organic solvent, e.g., methyl ethyl ketone. Since the heat-curable acrylic resin has a polar functional group, such as hydroxyl or carboxyl group, in the side chains of the resin, it can form hydrogen bonds with the substrate, such as polyester or cellulose acetate substrate. The hydrogen bonds contribute to an improvement in the adhesion of the coating to the substrate.

It is desirable that a curing agent for the heat-curable resin can easily react with the reactive group (e.g., hydroxyl or carboxyl group) of heat-curable acrylic resin, and, for instance, is at least one compound selected from the group consisting of isocyanate, melamine formaldehyde, urea formaldehyde, polyaziridine, titanate, zirconium composite, and epoxy.

In view of preparation efficiency, preparation costs and scratch resistance, a UV-curable resin is more suitable as the binder of the light-absorbing layer. A UV-curable light-absorbing layer can be formed by adding a UV-curable resin, the light-absorbing particles and additives in a predetermined ratio to an appropriate solvent, and dissolving or dispersing the mixture to obtain a coating solution, and applying the coating solution to the light diffusion layer. As the additives, there can be exemplified, without any limitation, photopolymerization initiators, UV absorbers, photostabilizers, antioxidants, leveling agents, defoamers, coupling agents, and particle dispersants.

As UV-curable resins, there can be used compositions in which a monomer, an oligomer and a prepolymer containing at least one polymerizable unsaturated bond, such as acryloyl, methacryloyl, acryloyloxy or methacryloyloxy group, are properly mixed according to the intended application. Examples of suitable monomers include, but are not limited to, methacrylate, methylmethacrylate, methoxy polyethylene methacrylate, cyclohexylmethacrylate, phenoxyethylmethacrylate, ethyleneglycoldimethacrylate, dipentaerythritolhexaacrylate, and styrene. Examples of suitable oligomers or prepolymers include acrylates, such as polyester acrylate, polyurethane acrylate, epoxy acrylate, polyethyl acrylate, alkyd acrylate, melamine acrylate and silicone acrylate, unsaturated polyesters, and epoxy-based compounds. In the case where the cured film is required to have superior durability, such as heat resistance, wear resistance and solvent resistance, under severe conditions, it is preferred to increase the amount of the monomer used and to use a tri- or higher functionality acrylate-based monomer.

It is necessary to add a photopolymerization initiator to cure the UV-curable resin. The photopolymerization initiator is preferably selected from the group consisting of acetophenones, e.g., diethoxyacetophenone, benzyldimethylketal and 1-hydroxycyclohexyl-phenylketone; benzoin ethers, e.g., benzoin methyl ether, benzoin ethyl ether, benzoin isopropyl ether and benzoin isobutyl ether; benzophenones, e.g., benzophenone, 4-phenylbenzophenone, 4-benzoyl-N,N-dimethyl-N-[2-(1-oxo-2-propenyloxy)ethyl]benzenemethanaminium bromide and (4-benzoylbenzyl) trimethylammonium chloride; thioxanthones, e.g., 2,4-diethylthioxanthone and 1-chloro-4-dichlorothioxanthone; 2,4,6-trimethylbenzoyldiphenylbenzoyloxide; and mixtures thereof. As a promoter (sensitizer), there can be used an amine compound, e.g., N,N-dimethylparatoluidine. The content of the photopolymerization initiator is preferably 0.1~10 wt % with respect to the solid content of the UV-curable resin.

When the coating layer is formed by UV curing, the materials are appropriately mixed or an apparatus is needed in order to meet the following properties:

i) Intervention of oxygen must be avoided upon UV curing (a nitrogen ($N_2$) purging apparatus is required);

ii) Curing shrinkage must be minimized; and iii) Adhesion to the substrate must be good.

[Adhesive Layer]

To effectively mount the optical film of the present invention on an OLED display, an adhesive layer can be formed on a surface of the transparent substrate opposite to the surface on which the light-absorbing layer is formed. Like the application of the light-absorbing layer, the adhesive layer is formed by wet coating, e.g., gravure coating, die coating, or comma coating. The adhesive layer can be directly formed by coating. For better productivity, a double-sided adhesive film is produced by a separate process or purchased, and then integrally laminated with the optical film.

The adhesive layer can be formed by applying a mixed coating solution containing an acrylate copolymer, a binder, such as ethylacetate, toluene or methyl ethyl ketone, and a curing agent, such as hexamethylene diisocyanate (HMDI) or toluene diisocyanate (TDI), to the transparent substrate, followed by drying.

[OLED Display]

The light-emitting device of the OLED display includes a cathode, a light-emitting layer, an anode, and a transparent substrate laminated in this layer. As specifically shown in FIG. 1, the light-emitting device is composed of a cathode, an electron transport layer, a light-emitting layer, a hole transport layer, a hole injection layer, an anode, and a glass substrate. The optical film of the present invention is mounted on top of the transparent substrate (ITO-deposited glass substrate) of the light-emitting device such that the light-absorbing layer of the optical film is positioned opposite to the light-emitting device. This structure allows the OLED display to have high-brightness properties.

EXAMPLES

The present invention will now be described in more detail with reference to the following examples and comparative examples. However, these examples do not serve to limit the invention.

The physical properties of optical films produced in the following examples and comparative examples were evaluated in accordance with the following respective procedures.

(1) Total light transmittance

The light transmittance of optical films was measured in accordance with the ASTM D1003 standard method using a transmittance and haze meter (manufactured by Nippon Denshoku Kogyo Co., Japan). Each of the samples was arranged such that light was propagated in the following order: light source→optical film (adhesive layer/transparent substrate/light-diffusing particle coated layer/light-absorbing particle coated layer)→integrating sphere. The total light transmittance of the sample was calculated by the following equation:

Total light transmittance=(transmitted light/incident light)×100 (%)

(2) Unidirectional light transmittance

The light transmittance of optical films was measured in accordance with the ASTM D1003 standard method using a transmittance and haze meter (manufactured by Nippon Denshoku Kogyo Co., Japan). At this time, each of the samples was arranged such that light was propagated in the following orders: (i) light source→optical film (transparent substrate/light-diffusing particle coated layer/light-absorbing particle coated layer)→integrating sphere; and (ii) light source→optical film (light-absorbing particle coated layer/light-diffusing particle coated layer/transparent substrate)→integrating sphere. The unidirectional light transmittance of the sample is defined as the difference between the light transmittance of the two arrangements.

(3) Reflectance

5° reflectance for light-absorbing particle coated layers was measured at a wavelength range of 380 nm to 750 nm under a D65 light source using a UV visible spectrometer (Perkin Elmer, U.S.A.).

(4) Brightness

The brightness of OLED displays was measured under external light (500 lx) using a BM-7 Luminance calorimeter (Topcon). The OLED displays had a structure of OLED light-emitting device/optical film (adhesive layer/transparent substrate/light-absorbing particle coated layer.

(5) Contrast (CR)

The brightness of OLED displays was measured under external light (500 lx) using the apparatus used in (4), and then the contrast of the OLED displays was calculated by the following equation:

Contrast (CR)=(brightness of white light)/(brightness of black light)

Example 1

A 100 μm-thick polyethylene terephthalate (PET) film was used as a transparent substrate. A coating solution for a light diffusion layer was prepared by the following procedure. First, 200 parts by weight of light-diffusing particles having an average diameter of 5 μm were sufficiently stirred and dispersed in a mixed solvent containing 300 parts by weight of isopropyl alcohol (IPA), 300 parts by weight of methyl ethyl ketone (MEK), 200 parts by weight of toluene and 100 parts by weight of cyclopentanone to obtain a dispersion of the light-diffusing particles. 100 parts by weight (solid content) of a heat-curable acrylic resin (Aekyung Chemical, Korea) was mixed with the dispersion, and then stirred for 3 hours to obtain a particle-dispersed resinous solution. One hour before formation of a light diffusion layer, 25 parts by weight of an isocyanate curing agent (Aekyung Chemical, Korea) was added to the resinous solution to prepare a coating solution for a light diffusion layer. The coating solution was coated on the transparent substrate by bar coating and was dried to form a 7 μm-thick light diffusion layer. Separately, 200 parts by weight of light-absorbing particles having an average diameter of 5 μm were sufficiently stirred and dispersed in a mixed solvent containing 300 parts by weight of isopropyl alcohol (WA), 300 parts by weight of methyl ethyl ketone (MEK), 200 parts by weight of toluene and 100 parts by weight of cyclopentanone to obtain a dispersion of the light-absorbing particles. 50 parts by weight (solid content) of a heat-curable acrylic resin (Aekyung Chemical, Korea) was mixed with the dispersion, and then stirred for 7 hours to obtain a particle-dispersed resinous solution. One hour before formation of a light-absorbing layer, 25 parts by weight of an isocyanate curing agent (Aekyang Chemical, Korea) was added to the resinous solution to prepare a coating solution for a light-absorbing layer. The coating solution was coated on the light diffusion layer by bar coating and was dried to form a 7 μm-thick light-absorbing layer 16. A multilayer optical film thus produced is shown in FIG. 3. The physical properties of the optical film were evaluated in accordance with the procedures described above.

Example 2

A multilayer optical film was produced in the same manner as in Example 1, except that the light-absorbing particles were used in an amount of 150 parts by weight to form a light-absorbing layer on the light diffusion layer.

Example 3

An OLED display was manufactured by laminating the optical film produced in Example 1 or 2 in such a manner that an adhesive layer positioned opposite to the light-absorbing layer of the optical film was attached on top of a transparent substrate (indium-titanium oxide (ITO) glass) of a 14.1-inch OLED display (Samsung Electronics, Korea). The brightness of white light was measured at 500 lx.

Comparative Example 1

For comparison with the optical properties of an OLED display employing a conventional circular polarizing film (consisting of a linear polarizing plate and a quarter (¼)-wavelength plate), the optical properties of the polarizing film were evaluated and the brightness of the OLED display employing the polarizing film was measured.

Comparative Example 2

An OLED display wherein no optical film was attached on top of a transparent glass substrate of an OLED light-emitting device was manufactured. The contrast of the OLED display was measured under external light (500 lx).

Comparative Example 3

An OLED display was manufactured by attaching a monolayer optical film comprising only a light-absorbing layer on top of a transparent glass substrate of a light-emitting device. The contrast of the OLED display was measured under external light (500 lx).

The optical properties of the optical films and the OLED displays are shown in Tables 1 and 2 below.

TABLE 1

Comparison of brightness

| | Light diffusion layer | | Light-absorbing layer | | Light transmittance (PET -> coated layer) | Light transmittance (Coated layer -> PET) | Unidirectional light Transmittance | Brightness of white light (external light: 500 lx) |
|---|---|---|---|---|---|---|---|---|
| | Transparent resin (parts by weight) | Particles (parts by weight) | Transparent resin (parts by weight) | Particles (parts by weight) | | | | |
| Ex. 1 | 100 | 200 | 100 | 200 | 65% | 40% | 25% | 393 cd/m² |
| Ex. 2 | 100 | 200 | 100 | 150 | 60% | 40% | 20% | 390 cd/m² |
| Comp. Ex. 1 | Polarizing film | | | | 45% | 45% | 0% | 179 cd/m² |
| Comp. Ex. 3 | Light-absorbing monolayer film (no light diffusion layer) | | | | 64% | 45% | 19% | 384 cd/m² |

TABLE 2

Comparison of contrast (CR)

| | Light diffusion layer | | Light-absorbing layer | | Contrast (white/black) |
|---|---|---|---|---|---|
| | Transparent resin (parts by weight) | Particles (parts by weight) | Transparent resin (parts by weight) | Particles (parts by weight) | (external light: 500 lx) |
| Example 1 | 100 | 200 | 100 | 200 | 7.1 |
| Example 1 | 100 | 200 | 100 | 150 | 6.6 |
| Comparative Example 3 | Light-absorbing monolayer film (no light diffusion layer type) | | | | 6.3 |

TABLE 2-continued

Comparison of contrast (CR)

| | Light diffusion layer | | Light-absorbing layer | | Contrast (white/black) |
|---|---|---|---|---|---|
| | Transparent resin (parts by weight) | Particles (parts by weight) | Transparent resin (parts by weight) | Particles (parts by weight) | (external light: 500 lx) |
| Comparative Example 2 | Glass substrate | | | | 4.0 |

As can be seen from the data shown in Tables 1 and 2, the respective OLED displays employing the optical films of the present invention produced in Examples 1 and 2 showed enhanced brightness, compared to the OLED display employing a conventional circular polarizing film manufactured in Comparative Example 1. In addition, the OLED displays employing the optical films of the present invention produced in Examples 1 and 2 showed improved contrast properties, compared to the OLED displays manufactured in Comparative Examples 2 and 3.

As apparent from the foregoing, the OLED displays employing the optical film of the present invention, which was produced by coating light-absorbing particles on a transparent substrate, showed superior brightness properties as compared to the display employing the conventional polarizing film. In addition, as can be seen from the reflectance graph shown in FIG. 6, since the optical film according to the present invention has an average surface reflectance of 5% or lower, the visibility and sharpness of images from the OLED displays employing the optical film could be improved.

Furthermore, the OLED displays employing the optical film of the present invention showed improved contrast properties, compared to the OLED display wherein no optical film was attached on top of a transparent glass substrate of an OLED light-emitting device and the OLED display manufactured by attaching a monolayer optical film comprising a light-absorbing layer only on top of a transparent glass substrate of a light-emitting device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A low-reflectivity, brightness-enhancing multilayer optical film for a display comprising a transparent substrate, a light diffusion layer formed on a surface of the transparent substrate and a light-absorbing layer formed on the light diffusion layer wherein the light diffusion layer contains a resin and spherical particles, and the light- absorbing layer contains a transparent resin and core-shell structured light-absorbing particles composed of a light- absorbing agent as a material for the core and a transparent resin as a material for the shell.

2. The multilayer optical film according to claim 1, wherein the optical film shows unidirectional light transmittance due to the presence of the light diffusion layer or the light-absorbing layer.

3. The multilayer optical film according to claim 1, wherein the transparent substrate has a thickness of 10~300 μm.

4. The multilayer optical film according to claim 1, wherein the light diffusion layer formed on a surface of the transparent substrate contains a resin and spherical particles.

5. The multilayer optical film according to claim 1, wherein the light-absorbing layer contains 100 parts by weight of a transparent binder resin, and 50~500 parts by weight of core-shell structured light-absorbing particles composed of a light-absorbing agent as a material for the core and a transparent resin as a material for the shell.

6. The multilayer optical film according to claim 1, wherein the light diffusion layer and the light-absorbing layer formed into a multilayer by wet coating.

7. The multilayer optical film according to claim 1, wherein the light-diffusing particles meet the following requirements:
the light-diffusing particles have a diameter of 1 μm to 50 μm; and
the light-diffusing particles are spherical transparent particles selected from the group consisting of silica, acrylic resins, polystyrene resins, styrene-acrylic copolymer resins, polyethylene resins, epoxy resins, silicone resins, silicone rubbers, and mixtures thereof.

8. The multilayer optical film according to claim 1, wherein the light-absorbing particles meet the following requirements:
one core is present in one light-absorbing particle;
the light-absorbing particles have a diameter of 1 μm to 50 μm;
the core is positioned inside the light-absorbing particle such that the eccentricity of the core is below 0.5 (eccentricity=distance from the center of the light-absorbing particle to the center of the core/radius of the light-absorbing particle); and
the average diameter ratio of the core to the light-absorbing particle is between 0.2 and 0.75.

9. The multilayer optical film according to claim 1, wherein 50% of the light-absorbing particles present in the light-absorbing layer formed on the light diffusion layer are arranged to have a monolayer structure.

10. The multilayer optical film according to claim 1, wherein the light-absorbing agents are selected from the group consisting of carbon black, black pigments, black dyes, iron oxides, and mixtures thereof.

11. The multilayer optical film according to claim 1, wherein the light-absorbing particles are composed of light-absorbing agents selected from the group consisting of carbon black, black pigments, black dyes, iron oxides or mixtures thereof, and resins.

12. The multilayer optical film according to claim 1, wherein the material constituting the shell is selected from the group consisting of acrylic resins, styrene resins, polyethylene terephthalate resins, acrylic-styrene copolymer resins, and mixtures thereof.

13. The multilayer optical film according to claim 1, wherein the transparent substrate is a film or sheet made of a material selected from the group consisting of polyethylene terephthalate, polyethylene naphthalate, polycarbonate, polymethylmethacrylate, polystyrene, and mixtures thereof; and the transparent resin is selected from the group consisting of acrylic resins, methacrytic resins, urethane resins, styrene resins, epoxy resins, polyester resins, and mixtures thereof.

14. The multilayer optical film according to claim 1, wherein the light-absorbing layer has an average surface reflectance of 6% or less.

15. The multilayer optical film according to claim 6, wherein the wet coating is selected from the group consisting of gravure coating, die coating, comma coating, capillary coating, and bar coating.

16. The multilayer optical film according to claim 1, further comprising an adhesive layer formed on a surface of the transparent substrate opposite to the surface on which the light-absorbing layer is formed.

17. An OLED display wherein the optical film according to claim 1 is mounted on top of a transparent substrate of a light-emitting device including a cathode, a light-emitting layer, an anode and the transparent substrate laminated in this order from the bottom such that the light-absorbing layer of the optical film is positioned opposite to the light-emitting device.

* * * * *

UNITED STATES PATENT AND TRADEMARK OFFICE
CERTIFICATE OF CORRECTION

PATENT NO.       : 7,446,462 B2                                          Page 1 of 1
APPLICATION NO.  : 11/174901
DATED            : November 4, 2008
INVENTOR(S)      : Lim et al.

It is certified that error appears in the above-identified patent and that said Letters Patent is hereby corrected as shown below:

Column 10
Line 67 "eyclopentanone" should read --cyclopentanone--.

Column 11
Line 14 "(WA)" should read --(IPA)--.

Signed and Sealed this

Third Day of March, 2009

JOHN DOLL
*Acting Director of the United States Patent and Trademark Office*